United States Patent
Nozawa et al.

(10) Patent No.: US 6,844,119 B2
(45) Date of Patent: Jan. 18, 2005

(54) METHOD FOR PRODUCING A HALFTONE PHASE SHIFT MASK BLANK, A HALFTONE PHASE SHIFT MASK BLANK AND HALFTONE PHASE SHIFT MASK

(75) Inventors: Osamu Nozawa, Fuchu (JP); Hideaki Mitsui, Fuchu (JP); Laurent Dieu, Austin, TX (US)

(73) Assignees: Hoya Corporation, Tokyo (JP); Dupont Photomasks, Inc., Round Rock, TX (US)

( * ) Notice: Subject to any disclaimer, the term of this patent is extended or adjusted under 35 U.S.C. 154(b) by 103 days.

(21) Appl. No.: 10/207,033

(22) Filed: Jul. 30, 2002

(65) Prior Publication Data

US 2004/0023125 A1 Feb. 5, 2004

(51) Int. Cl.[7] .............................. G03F 9/00; B32B 15/00
(52) U.S. Cl. ........................................... 430/5; 428/433
(58) Field of Search ...................... 430/5, 322; 428/433

(56) References Cited

U.S. PATENT DOCUMENTS

| | | |
|---|---|---|
| 5,897,977 A | 4/1999 | Carcia et al. |
| 5,939,227 A | 8/1999 | Smith |
| 6,395,433 B1 * | 5/2002 | Smith .............................. 430/5 |
| 6,653,027 B2 * | 11/2003 | Angelopoulos et al. ......... 430/5 |

OTHER PUBLICATIONS

Dieu, et al., "Ion Beam Sputter–Deposited SiN/TiN Attenuating Phase–Shift Photoblanks," 20th Annual BACUS Symposium on Photomask Technology, Proceedings of SPIE vol. 4186, 2001 SPIE, pp. 810–817.

Carriere, et al., "Characterization of Silicon Nitride Films Deposited on GaAs by RF Magnetron Cathodic Sputtering," The Electrochemical Society,Inc., J. Electrochem. Soc., vol. 137, No. 5, May 1990.

H. Windischmann, "An Intrinsic Stress Scaling Law for Polycrystalline Thin Films Prepared by Ion Beam Sputtering," J. Appl. Phys., vol. 62, No. 5, Sep. 1, 1987.

* cited by examiner

*Primary Examiner*—S. Rosasco
(74) *Attorney, Agent, or Firm*—Sughrue Mion, PLLC

(57) ABSTRACT

A method for producing a halftone phase shift mask blank having a semi-transmission film on a transparent substrate includes alternately laminating, on a transparent substrate, thin layers substantially made of nitrogen and titanium and thin layers substantially made of nitrogen and silicon to thereby form thereon a multi-layered semi-transmission film, followed by heating the semi-transmission film at 300° C. or higher.

4 Claims, 3 Drawing Sheets

FIG. 1B  LIGHT AMPLITUDE DISTRIBUTION OF MASK

FIG. 1C  LIGHT INTENSITY DISTRIBUTION ON TRANSFERRED BODY

METHOD FOR PRODUCING A HALFTONE PHASE SHIFT MASK BLANK, A HALFTONE PHASE SHIFT MASK BLANK AND HALFTONE PHASE SHIFT MASK

BACKGROUND OF THE INVENTION

1. Field of the Invention

The present invention relates to method for producing a halftone phase shift mask blank, a halftone phase shift mask blank produced by the method thereof, and a halftone phase shift mask.

2. Description of the Related Art

The recent photolithography requires two important factors, namely, high resolution and a focus depth, which, however, are contradictory to each other. It has been found out that practical resolution in photolithography can not be increased even if the numerical aperture (NA) of lenses in exposure devices is enlarged, or the wavelength of the light that the lenses therein shall receive is shortened (see, for example, *Monthly Semiconductor World,* December 1990; *Applied Physics,* Vol. 60, November 1991).

Under such a circumstance, phase shift lithography is promising as a next-generation technology in the art of photolithography. The phase shift lithography increases the resolution in photolithography only by shifting the phase of photomasks with no change in optical systems. In such phase shift lithography, concretely, the light running through a photomask undergoes phase shift to thereby remarkably increase the resolution based on the mutual interference of the transmitted light.

The phase shift mask in that technology possesses both light intensity information and phase information, and various types of the mask are known, including, for example, Levenson masks, pattern-assist masks, self-alignment masks (edge-stress masks), etc. Compared with conventional photomasks possessing light intensity information only, these phase shift masks have a complicated structure and require a high-level technique for their production.

Recently, a halftone phase shift mask as one type of such phase shift masks has been developed. In its semi-transmission area, the halftone phase shift mask possesses two functions; one is for substantially shielding the light applied thereto, and the other is for shifting the light phase (in general, for phase inversion). Therefore, the mask of the type does not require a shielding film pattern and a phase shift film pattern separately formed thereon, and its advantage is that its constitution is simple and its production is easy.

As illustrated in FIGS. 1A through 1C, the mask pattern formed on a transparent substrate 100 comprises a transmission area 200 (in which the substrate is exposed out) that transmits the light to substantially participate in pattern transfer, and a semi-transmission area 300 (which acts both for light shielding and for phase shifting) that transmits the light substantially not to participate in pattern transfer (FIG. 1A). The phase of the light having passed through the semi-transmission area is so shifted that the thus-shifted light phase may be substantially the inverse of the phase of the light having passed through the transmission area (FIG. 1B). Thus, the light having passed through the part around the boundary between the semi-transmission area and the transmission area and having entered the opposite areas through diffraction can be mutually canceled out so that the light intensity at the boundary may be nearly zero and the contrast at the boundary is increased, or that is, the resolution for pattern transfer is thereby increased (FIG. 1C).

The semi-transmission area of the halftone phase shift mask of the type mentioned above must satisfy the optimum requirements of both the light transmittance and the phase shift through it.

For most suitably controlling the necessary optimum requirements of the mask, one method has been proposed, which comprises forming an alternate laminate of silicon nitride and titanium nitride for the semi-transmission area of the mask (L. Dieu, P. F. Carcia, H. Mitsui, and K. Ueno, "Ion Beam Sputter-Deposited SiN/TiN Attenuating Phase-Shift Phtoblanks", *SPIE,* 4186, 810 (2000)).

The semi-transmission area of the phase shift mask blank proposed has a multi-layered structure of an alternate laminate made of silicon nitride having high transmissibility for ArF excimer laser (193 nm) and titanium nitride of good shieldability from the laser, therefore realizing both the transmittance and the phase angle suitable to phase shift masks.

For controlling the transmittance of the mask from the blank, the overall film ratio of the silicon nitride layers to the titanium nitride layers is varied.

The number of the silicon nitride and titanium nitride layers that constitute the laminate structure of the mask is so controlled that the thickness of one layer is at most $\frac{1}{10}$ of the wavelength of the light to be applied to the mask. In that condition, the multi-layered semi-transmission area of the mask may be optically considered as a single layer for exposure to light.

Another advantage of the multi-layered phase shift mask in which the thickness of each layer is reduced is that the profile of the pattern cross-section is prevented from being deformed.

Phase shift mask blanks are required to be resistant to chemicals such as acid and alkali solutions in order that the phase angle and the transmittance of the masks from them do not vary while they are indispensably washed with such solutions in the process of processing them into masks. Silicon nitride is highly resistant to chemicals such as acid and alkali solutions, and mask blanks of which the surface layer of the semi-transmission area is made of silicon nitride may have good chemical resistance.

In addition to the problems with the recent phase shift masks noted above that are caused by the material of the semi-transmission film of the masks, other serious problems with them are particles often adhering to the mask blanks and pin holes often formed in the masks. For example, in a conventional magnetron sputtering device for forming a semi-transmission film on mask blanks, particles having a size of about 1 micron or smaller may often adhere to the film formed, owing to the arcs generated in the device. The particles thus having adhered to the film are dropped off while the processed masks are washed, thereby to form pin holes in the masks. For producing masks having few pin holes, therefore, it is necessary to reduce the number of the particles that may adhere to the semi-transmission film while the film is formed.

For reducing the particles to adhere to the semi-transmission film, the arcs in the process of film formation must be controlled. However, a titanium target for forming a film of titanium nitride easily reacts with nitrogen, and titanium nitride to cause arcs readily deposits on the target. Therefore, in principle, ion beam sputtering that causes few arcs is desired for forming a titanium nitride film with few particles adhering thereto. In the device of ion beam sputtering of a target onto a substrate, ion generation and acceleration necessary for the target sputtering are effected in an ion source unit disposed separately from the target and the substrate, and therefore, high voltage application to the target that causes arcs is unnecessary.

In addition, in the ion beam sputtering device, the gas pressure between the target and the substrate is low, as compared with that in the magnetron sputtering device. In the ion beam sputtering device, therefore, the particles sputtered from the target may directly enter the substrate, not colliding against gas molecules, and, in addition, their kinetic energy is large. Accordingly, in this, dense and smooth films of low surface roughness can be formed.

If dense and smooth films of silicon nitride and titanium nitride are alternately formed through such ion beam sputtering, it is possible to prevent the mutual diffusion in the interface between the neighboring films in the alternate multi-layered structure while the laminate structure is exposed to light, and the laminate structure is highly durable to exposure to light.

However, the ion beam sputtering process of forming a silicon nitride film still has the following problems.

Specifically, in the process, since the gas pressure between the target and the substrate is low and the kinetic energy of the particles sputtered from the target is high, the silicon nitride film formed often receives compression stress (T. Carriere, B. Agius, I. Vickridge, J, Siejko, P. Alnot, "Characterization of Silicon Nitride Films Deposited on GaAS by RF Magnetron Cathodic Sputtering", *J. Electrochem. Soc.*, Vol. 137, No. 5, 1582 (1990); and H. Windischmann, "An intrinsic stress scaling law for polycrystalline thin films prepared by ion beam sputtering", *J. Appl. Phys.*, 62(5), 1800 (1987)). The compression stress of the silicon nitride film is kept still as such even when it is formed in a multi-layered semi-transmission film structure. In that condition, the internal stress of the multi-layered semi-transmission film worsens the planarity of the transparent substrate having the film formed thereon, and reduces the depth of focus of the film exposed to light. Still another problem is that, if the internal stress of the semi-transmission film is large, the substrate deforms before and after the patterning process, and therefore worsens the dimensional accuracy in patterning thereon.

SUMMARY OF THE INVENTION

The present invention has been made in consideration of the above-mentioned problems, and its object is to provide a method for producing a phase shift mask blank having a semi-transmission film or area that ensures a predetermined phase angle and a predetermined transmittance and has the advantages of good chemical resistance, good light resistance and reduced internal stress, and also to provide a method of processing the mask blank into a phase shift mask.

To attain the object as above, the constitution of the invention is as follows:

(1) A method for producing a halftone phase shift mask blank having a semi-transmission film on a transparent substrate, which comprises alternately laminating, on a transparent substrate, thin layers substantially made of nitrogen and titanium and thin layers substantially made of nitrogen and silicon to thereby form thereon a multi-layered semi-transmission film, followed by heating the semi-transmission film at 300° C. or higher.

(2) The method for producing a halftone phase shift mask blank of the above item (1), wherein the semi-transmission film is formed by ion beam sputtering.

(3) A mask blank produced according to the method of any of the above item (1) or (2).

(4) A mask produced by patterning the thin layers of the mask blank of the above item (3).

The phase shift mask blank of the invention is produced by alternately laminating, on a transparent substrate, thin layers substantially made of nitrogen and titanium and thin layers substantially made of nitrogen and silicon to thereby form thereon a multi-layered semi-transmission film, followed by heating the semi-transmission film at 300° C. or higher. In the mask blank thus produced, the stress of the semi-transmission film can be reduced.

From the viewpoint of the resistance of the mask blank to light, preferred is ion beam sputtering as making it possible to reduce the roughness of the interface between the layers constituting the semi-transmission film in the mask blank. However, the compression stress of the silicon nitride layers formed by ion beam sputtering is large. For reducing the stress of the semi-transmission film, heating the film as in the method of the invention is especially effective.

BRIEF DESCRIPTION OF THE DRAWINGS

FIGS. 1A through 1C show the pattern transfer principle of a half-tone phase shift mask;

DETAILED DESCRIPTION OF THE INVENTION

Figure 1A:
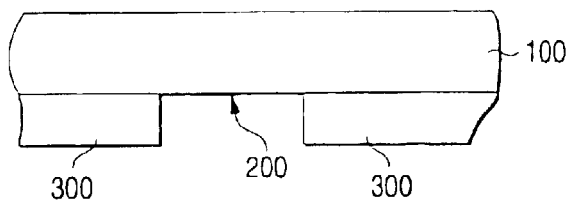

The invention is described in detail hereinunder.

In the halftone phase shift mask blank and the mask from the mask blank of the invention, the semi-transmission film or area is made of an alternately multi-layered film of thin layers substantially made of nitrogen and titanium and thin layers substantially made of nitrogen and silicon.

Selection of Materials

Silicon nitride well transmits light of, for example, ArF excimer laser (193 nm). For example, a silicon nitride film having an Si/N ratio of about 3/4, of which the thickness is so controlled that the phase angle thereof to ArF excimer laser (193 nm) is 180°, has an ArF excimer laser (193 nm) transmittance of at least 15%.

Apart from silicon nitride, other materials such as silicon oxide, aluminum nitride, aluminum oxide (alumina), magnesium fluoride and calcium fluoride also well transmit light. However, silicon nitride is better than the others in point of the chemical resistance and the dry etchability in patterning.

Another advantage of titanium nitride is that its film can reduce the light transmittance through it. The phase shift mask blank of the invention is required to have a reduced transmittance of, for example, 6% or 9%, and the requirement for the desired transmittance of the mask blank may be satisfied by varying the ratio of the titanium nitride layers to the silicon nitride layers that constitute the semi-transmission film in the mask blank.

The titanium nitride film has not only the function of controlling the transmittance of light for mask exposure thereto but also the function of controlling the transmittance of light for mask inspection with it. In general, the wavelength of the light for optical inspection is longer than that for patterning exposure. For mask inspection with ArF excimer laser, for example, the wavelength of the light is 257 nm or 364 nm. In such mask inspection, the transmittance of the masks must be at most 65%, and the transmittance of at most 40% will be enough for good inspection.

Apart from titanium oxide, other materials of metals and metal nitrides may be used for reducing the transmittance of masks in patterning exposure. However, titanium nitride is better than the others in point of the dry etchability in patterning and the light transmittance control in mask inspection.

Number of Layers, and Thickness of Layers

For controlling the light transmittance in mask patterning exposure, at least one titanium nitride layer and at least one silicon nitride layer may be formed on the substrate. However, if the number of the layers on the substrate is 2, 3 or so, it involves the following problems.

In the halftone phase shift mask of the invention, the ratio of the titanium nitride layers to the silicon nitride layers is varied to control the transmittance of the mask. If the number of the layers constituting the mask is 2, 3 or so, the thickness of one silicon nitride layer is large, and the light reflected on the interface between the titanium nitride layer and the silicon nitride layer interferes with the light reflected on the surface of the semi-transmission film. The problem with the case is that designing the film for transmittance control is difficult.

For stable production of halftone phase shift mask blanks having a desired transmittance and ensuring a desired phase angle, the production condition must be corrected. Some methods have heretofore been proposed for producing two or three-layered, halftone phase shift mask blanks with the multi-layered interference therein being taken into consideration. In actual multi-layered structures, however, other various problems of mutual interfacial diffusion, surface oxidation and interface roughness must be further taken into consideration, and, at present, the level of accuracy in layer lamination is not enough for halftone phase shift mask blank production control.

For reducing the interference effect of the multi-layered film structure and for facilitating the transmittance control of the semi-transmission film, increasing the number of the layers that constitute the film and reducing the thickness of each layer is effective. Concretely, for reducing the interference effect of the multi-layered film structure to a satisfactory degree, for example, the optical thickness of each layer may be at most 1/50 of the wavelength of the light for patterning exposure.

The optical thickness of a layer is a product of the refractive index of the layer and the thickness thereof. For example, the silicon nitride layer in the semi-transmission film to be patterned through exposure to ArF excimer laser (wavelength: 193 nm) has a refractive index of about 2.6, and its thickness may be at most about 10 nm/layer. Accordingly, in case where silicon nitride layers and titanium nitride layers are alternately laminated on a substrate to construct a halftone phase shift mask blank for patterning exposure to ArF excimer laser (193 nm), at least 6 pairs of titanium nitride/silicon nitride layers may be multi-layered to thereby reduce the interference effect in the thus-constructed mask blank to a satisfactory degree.

Based on the data as above, the transmittance of the semi-transmission film of a mask blank having a reduced interference effect may be represented by the following equation (1):

$$Ts \approx (1-R)^2 \exp(-4\pi k_s d_s/\lambda) \tag{1}$$

wherein:
Ts: transmittance of the semi-transmission film,
R: reflectance of the semi-transmission film,
$\lambda$: wavelength of the light for patterning exposure,
$k_s$: effective attenuation factor of the semi-transmission film,
$d_s$: thickness of the semi-transmission film of which the phase shift angle is 180° in patterning exposure, $$\epsilon_s = f\epsilon_m + (1-f)\epsilon_d,$$

$$\epsilon_s = (n_s^2 - k_s^2) - i2n_s k_s$$

$$n_s - ik_s = \sqrt{\epsilon_s},$$

$$(n_s - 1)d_s = \lambda/2,$$

$\epsilon_s$: effective dielectric constant of the semi-transmission area,
$\epsilon_m$: dielectric constant of titanium nitride,
$\epsilon_d$: dielectric constant of silicon nitride,
f: ratio of the titanium nitride thickness to the semi-transmission film thickness, and
$n_s$: effective refractive index of the semi-transmission film.

Based on the equation (1), the condition in the production of different halftone phase shift mask blanks can be controlled, and the mask blanks produced in the controlled condition satisfy different transmittance requirements.

A multi-layered structure of titanium nitride/silicon nitride layers in which the number of the layer pairs is smaller than 2 has an increased interference effect, and is quite difficult to satisfy the equation (1).

In the semi-transmission film of the mask blank of the invention which is, for example, so controlled that the phase angle is 180° and the transmittance is 6% in patterning exposure to ArF excimer laser (193 nm), the ratio of titanium nitride layer thickness/silicon nitride layer thickness is 13% or so, and the thickness of the semi-transmission film of the case is about 730 angstroms.

The other advantages of alternately laminating the different materials to increase the number of the layers that constitute the semi-transmission film are that the optical planning of the mask blanks is easy and the cross-sectional profile of the patterned masks is improved.

For patterning the halftone phase shift mask blank of the invention, for example, it is etched in dry in a fluorine-containing gas atmosphere such as $CF_4$ gas or $SF_6$ gas.

As in the recent tendency in the art, anisotropic etching is preferred for it in order that the profile of the cross section of the etched pattern can be made vertical to the substrate. However, even in anisotropic etching, the film may be often etched also in the horizontal direction relative to the substrate in some degree owing to the chemical reaction of the film with the fluorine-containing gas.

The etching rate of the titanium nitride film through chemical reaction with the fluorine-containing gas is larger than that of the silicon nitride film, and a step difference may be formed between the part of the titanium nitride layer and that of the silicon nitride layer in the cross section of the pattern. The step difference, if formed, in the cross section of the pattern is problematic in that the dimensional accuracy in patterning is difficult to control.

If the number of the layers that constitute the semi-transmission film is increased, and the thickness of the titanium nitride layers in the film is reduced, the fluorine-containing gas hardly reaches the titanium nitride layers, and, as a result, the film etching in the horizontal direction is retarded. In that manner, the step difference in the cross section of the pattern can be reduced.

Order of Layer Lamination

The order of laminating the titanium nitride layers and the silicon nitride layers to constitute the semi-transmission film is not specifically defined for the optical properties of the film. However, since the titanium nitride film is slightly dissolved in an aqueous sulfuric acid solution used in washing the patterned masks, it is desirable that the uppermost layer of the film is made of silicon nitride from the viewpoint of the chemical resistance of the masks.

In the step of washing the patterned masks, the titanium nitride layers are exposed out on the side walls of the cross section of the pattern. The acid component in the washing solution hardly reaches the titanium nitride layers if the thickness of the layers is reduced, and the durability of the semi-transmission film to the aqueous sulfuric acid solution is improved.

Film Formation and Particles in Film

The titanium nitride layers and the silicon nitride layers may be formed on the substrate by sputtering.

Two types of sputtering systems are known: one is a discharge sputtering system in which a negative high voltage is applied to the sputtering targets for layer deposition on a substrate and in which the ion generation and acceleration to induce sputtering is effected on the sputtering targets; and the other is an ion beam sputtering (ion beam deposition, IBD) system in which the ion generation and acceleration are effected in an ion source spaced from the sputtering targets. Any of these is employable herein.

Concretely, in case where the titanium nitride layers and the silicon nitride layers are formed in the discharge sputtering system, titanium and silicon sputtering targets are prepared separately, and these are sputtered in a nitrogen-containing gaseous atmosphere in a mode of reactive sputtering.

On the other hand, in the case where the titanium nitride layers and the silicon nitride layers are formed in the ion beam sputtering system (IBD), titanium and silicon sputtering targets are prepared separately, and an inert gas such as argon is supplied to an ion source from which the ions are to collide against the sputtering targets. In this, an assist ion source is used for supplying nitrogen ions toward the transparent substrate on which the titanium and silicon deposits are nitrided by the nitrogen ions.

In the discharge sputtering system as above, a large number of activated nitrogen ions to nitride the deposited films are also on the sputtering targets, and therefore the targets are also nitrided while the deposited films are nitrided.

On the other hand, in the ion beam sputtering system (IBD), the sputtering targets are sputtered by the inert gas such as argon, while the activated nitrogen to nitride the titanium and silicon deposits on the transparent substrate is selectively supplied to the area around the substrate from the assist ion source. In this, therefore, the nitriding of the sputtering targets is relatively retarded while the titanium and silicon deposits on the substrate are nitrided, as compared with that in the discharge sputtering system.

Silicon does not easily react with nitrogen. Therefore, the nitriding of the sputtering target in the discharge sputtering system to form silicon nitride films is generally negligible.

However, titanium easily reacts with nitrogen. Therefore, when titanium nitride films are formed in the discharge sputtering system, titanium nitride deposits on the sputtering target.

The electroconductivity of titanium nitride greatly differs from that of titanium. Therefore, the discharge sputtering system to form titanium nitride films often involves some serious problems. In the system, the titanium nitride deposit formed on the sputtering target greatly lowers the intended film formation speed and makes it difficult to control the film thickness. In addition, it often causes abnormal discharge in the system, and particles likely enter the film formed. These problems are often serious in the production of halftone phase shift mask blanks.

The problems with the discharge sputtering system for titanium nitride film formation can be solved by employing the ion beam sputtering system (IBD) for titanium nitride film formation in place of the discharge sputtering system. In the invention, the ion beam sputtering system (IBD) is preferred for forming the semi-transmission film. The film formed in the system has few particles, and the transmittance reproducibility of the halftone phase shift mask blank having the film is good.

Film Formation and Film Durability to Patterning Exposure

The durability to patterning exposure is one important factor of the halftone phase shift mask blank of the invention.

In the halftone phase shift mask blank having a multi-layered semi-transmission film of different materials alternately laminated on a substrate, the interface between the neighboring layers in the multi-layered semi-transmission film undergoes mutual diffusion owing to the light energy applied thereto in patterning exposure of the mask blank.

Concretely, the interface between the neighboring titanium nitride layer and silicon nitride layer in the semi-transmission film of the mask blank undergoes mutual diffusion in the step of patterning exposure of the mask blank, whereby the transmittance of the semi-transmission film may often vary before and after the exposure step.

The mutual diffusion in the interface between the neighboring titanium nitride layer and silicon nitride layer in the semi-transmission film is more remarkable when the number of the layers constituting the semi-transmission film is larger, or when the interface roughness is larger, or when the film density is smaller.

The increase in the number of the constituent layers and the increase in the interface roughness both result in the increase in the mutual diffusion area. The reduction in the film density results in the increase in the mutual diffusion speed.

In the semi-transmission film made of pairs of titanium nitride/silicon nitride layers of the invention, it is difficult to reduce the number of the constituent layers to smaller than 4 in view of the transmittance control and the patterned cross-sectional profile control mentioned above. Therefore, for improving the durability of the film to patterning exposure to light, it is necessary to reduce the roughness of the interface between the neighboring titanium nitride layer and silicon nitride layer in the film and to increase the density of the film.

For reducing the interface roughness, it is effective to unify the direction in which the sputtering particles reach the face of the substrate. For this, it is necessary to reduce the gas pressure between the sputtering targets and the transparent substrate in the sputtering chamber to thereby prevent the sputtering particles from colliding against the gas molecules in the sputtering process of forming the intended films on the substrate.

For increasing the film density, it is effective to impart thermal energy to the face of the substrate, to enlarge the energy of the sputtering particles, and to unify the direction in which the sputtering particles reach the face of the substrate. For this, it is necessary to accelerate the speed of the inert gas such as argon that colloids against the sputtering targets and to lower the gas pressure in the sputtering chamber.

The ion beam sputtering system (IBD) is suitable for reducing the surface roughness of the film formed and for increasing the density thereof.

The ion generation to induce sputtering requires a certain gas pressure.

In the discharge sputtering system, the sputtering targets and the substrate are disposed in the same vacuum chamber. In this, therefore, the sputtering chamber must be entirely so controlled that the gas pressure therein is suitable for sputtering.

On the other hand, in the ion beam sputtering system (IBD), only the ion source spaced from the others by grids having a limited conductance may be controlled to have a gas pressure suitable for ion generation. As a result, the gas pressure between the sputtering targets and the substrate in the sputtering chamber in the IBD system may be made relatively lower than that in the discharge sputtering system.

In addition, in the ion beam sputtering system (IBD), the speed of the ions to induce sputtering may be controlled by varying the grid voltage, and the ion generation may be controlled by varying the plasma density in the ion source. However, in the discharge sputtering system, it is difficult to independently control the ion speed and the ion generation, and for the optimum film deposition rate for better film thickness control, it is difficult to increase the discharge voltage. As opposed to this, in the ion beam sputtering system, the ion speed and the ion generation amount can be independently controlled. Therefore, in the ion beam sputtering system, the ion speed can be enlarged while the optimum film deposition rate is kept as such, and the density of the thin films formed can be increased.

Stress Generation and Relaxation

In the ion beam sputtering system (IBD), thin films having a higher density can be formed, but the films formed often have a high stress.

In the ion beam sputtering system (IBD), the energy of the sputtering particles that reach the substrate is high, and, in addition, the argon particles from the assist ion source rebound from the sputtering targets and reach the face of the substrate.

In this, therefore, the face of the substrate all the time receives the compression force owing to the collision of the high-energy particles thereto, and the films formed on the substrate in that condition often have a high compression stress.

Just after its deposition, the silicon nitride film formed in the ion beam sputtering system has an internal stress in the range of from $-2 \times 10^9$ Pa to $-4 \times 10^9$ Pa ("−" means that the stress is compression stress).

In the semi-transmission film of the invention, the ratio of the silicon nitride layer thickness to the overall thickness of the film amounts to at least 80%, and therefore, the stress of the silicon nitride layers constituting the film has a great influence on the stress of the film itself. For example, when the semi-transmission film is formed on a square, synthetic quartz substrate of 152 mm×152 mm×6.35 mm (thickness) in such a controlled manner that its phase angle to ArF excimer laser (193 nm) is 180° and its transmittance is 6%, the planarity change of the substrate thus having the film formed thereon becomes in the range of from 1 to 1.5 $\mu$m.

If the internal stress of the semi-transmission film formed on a transparent substrate is large, the planarity of the substrate varies before and after patterning the film and the dimensional accuracy of the pattern is low. In addition, if the planarity of the substrate oversteps the depth of focus in patterning exposure, the pattern resolution lowers.

For example, the planarity of the substrate of the halftone phase shift mask for ArF excimer laser (193 nm) must be at most 0.5 $\mu$m. The planarity of the mask depends on the planarity of the transparent substrate and on the film stress. On the presumption that the planarity of the nude substrate is 0 (zero), the stress of the film formed on the substrate must be within $\pm 1 \times 10^9$ Pa.

For reducing the film stress, it is effective to lower the film density, which, however, lowers the durability of the film to exposure to light and therefore should not apply to the semi-transmission film of the invention.

Another effective method for reducing the film stress is to heat the substrate while coated with a film. However, most transparent substrates used these days for halftone phase shift masks have large heat capacity and almost completely transmit light. Therefore, it is extremely difficult to uniformly heat them in ordinary sputtering devices in such a manner that the coated substrates have no particles adhering thereto.

In the method of the invention, the substrate is, after processed to have a semi-transmission area thereon, heated so as to lower its internal stress to a degree acceptable for phase shift mask blanks and also for phase shift masks.

In the method, the semi-transmission film is formed on the substrate in a compressed condition owing to the high-energy particles applied thereto, and this expands through the heat treatment. The thermal expansion coefficient of synthetic quartz is extremely small. Therefore, even when the temperature of the film-coated transparent substrate is lowered after the heat treatment, only the semi-transmission film on the substrate shrinks. In this stage, since the compression stress which the semi-transmission film had before the heat treatment is reduced, the thickness of the film increases in some degree as compared with that before the heat treatment.

The silicon nitride layer to be the outermost layer of the semi-transmission film of the invention is highly resistant to corrosion at room temperature, but at high temperatures, its surface is oxidized. Preferably, therefore, the heat treatment is effected in an inert gas such as nitrogen or argon.

The heat treatment at higher temperatures is more effective for reducing the internal stress of the film-coated substrate. In the invention, therefore, the heat treatment is effected at 300° C. or higher to attain the better result of internal stress reduction.

However, if the temperature in the heat treatment is higher than 800° C., the interface between the neighboring titanium nitride layer and silicon nitride layer of the semi-transmission film undergoes mutual diffusion to greatly vary the optical properties of the film. Therefore, it is desirable that the temperature in the heat treatment is not higher than 800° C.

Step of Film Deposition

Figure 2:
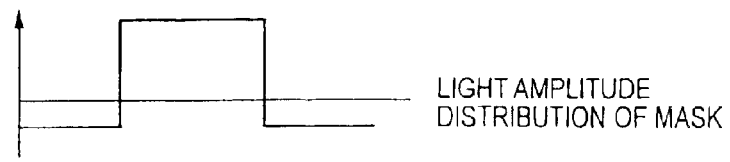
FIG. 2 shows an outline of an ion beam sputtering device used for fabricating a halftone phase shift mask.
Figure 2:
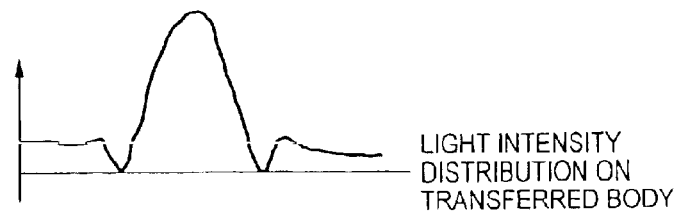
Figure 2:
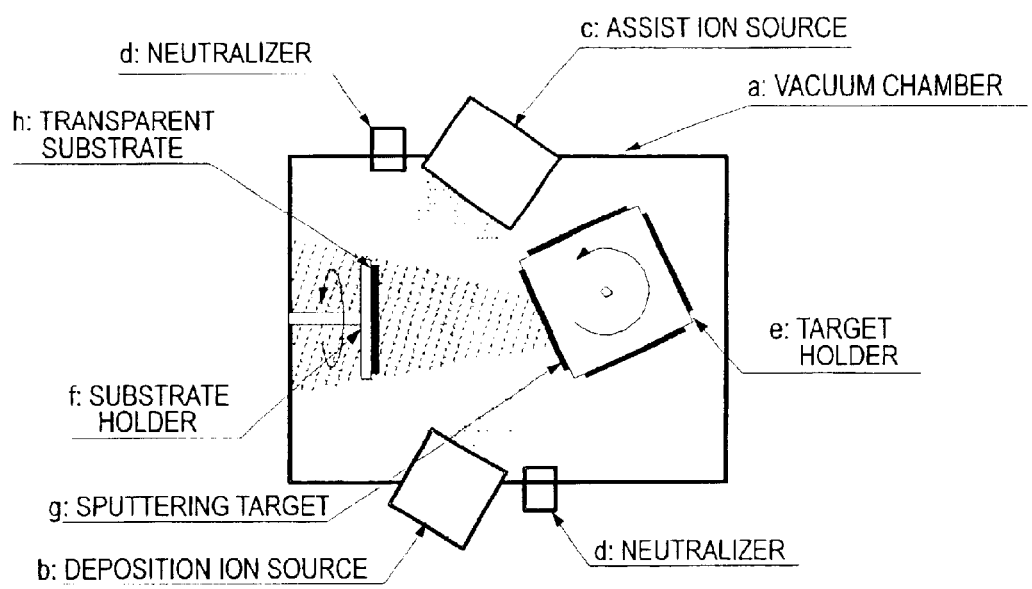

Using an ion beam sputtering device as in FIG. 2, fabricated is a halftone phase shift mask blank. The device has a vacuum chamber (a), which is equipped with a deposition ion source (b), an assist ion source (c), a neutralizer (d), a target holder (e) and a substrate holder (f). A sputtering target (g) is mounted on the target holder (e). In the invention, titanium and silicon targets are mounted thereon. The target holder (e) has a rotary mechanism, and the targets to be sputtered can be selected by rotating it. The sputtering target (g) is disposed to face the ion running direction in which the ions from the deposition ion source (b) run. The neutralizer (d) has the function of producing electrons and monitoring the ion sources to thereby prevent the vacuum chamber (a) from being electrically charged by the ions from the ion sources. On the substrate holder (f), mounted is a transparent substrate (h) to be coated with a semi-transmission film. The transparent substrate (h) is disposed to face the ion running direction in which the ions from the assist ion source (c) run. The vacuum chamber (a) is degassed by a vacuum pump.

A DC power source and an RF power source may be used for producing ions in the ion sources. In the invention, used is an RF power source, as in FIG. 3. In the RF ion source, an ionization gas is introduced into a quartz dome (i), and an RF power is introduced thereinto through induction coupling. The quartz dome (i) is spaced from the vacuum chamber (a) via a grid having a limited conductance.

Figure 3:
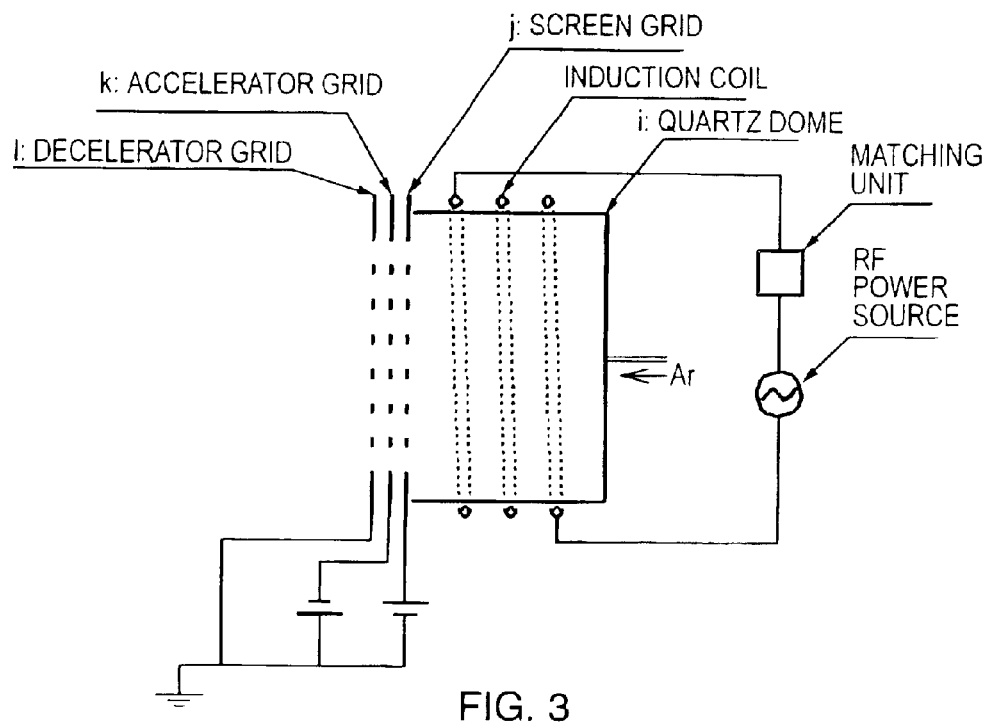
FIG. 3 shows a structure of an ion source using an RF power source.

As illustrated in FIG. 3, the grid is composed of a screen grid (j), an accelerator grid (k) and a decelerator grid (l). A positive voltage of from 500 to 1,000V is applied to the screen grid (j), and this is referred to as a beam voltage. The beam voltage corresponds to the ion energy from the ion source. A negative voltage of from –50 to –500 V is applied to the accelerator grid (k), and this is referred to as a suppresser voltage. The suppresser voltage is necessary for the ion source operation and for the beam diffusion control. The decelerator grid (l) is generally earthed. The decelerator grid (l) may be omitted, but it is effective for preventing film deposition in the ion source. The current that runs through the screen grid (j) is referred to as a beam current. The beam current corresponds to the quantity of ions from the ion source.

The ion source operation is described. The vacuum chamber (a) is degassed to such a degree that its atmosphere does not have any negative influence on the properties of the film to be formed, and then the neutralizer (d) is driven in the controlled condition. While the neutralizer (d) is driven, the gas to be ionized is introduced into the quartz dome (i). An inert gas such as argon is introduced into the deposition ion source (b). Into the assist ion source (c), introduced is a gas that reacts with the substance of the sputtering target (g). In case where a titanium nitride film and a silicon nitride film to constitute the semi-transmission film of the invention are to be formed, nitrogen serving as a reactive gas is introduced into the assist ion source (c). In that condition, the RF power source is then turned on to apply the beam voltage and the suppresser voltage to the system, and the ion source is thus driven, triggered by gas and high voltage application thereto. The ion current varies, depending on the RF power and the gas flow rate, but, in general, it is controlled by the RF power.

The film deposition rate is controlled by the beam voltage and the beam current to the deposition ion source (b); and the film thickness is controlled by the deposition time.

The effect of the reactive assist gas is controlled by the beam current to the assist ion source (c) and by the flow rate of the reactive assist gas. The beam voltage to the assist ion source (c) must be kept low so that the film formed on the transparent substrate is not etched. Preferably, it is at most 50 V.

Step of Heat Treatment

Figure 4:
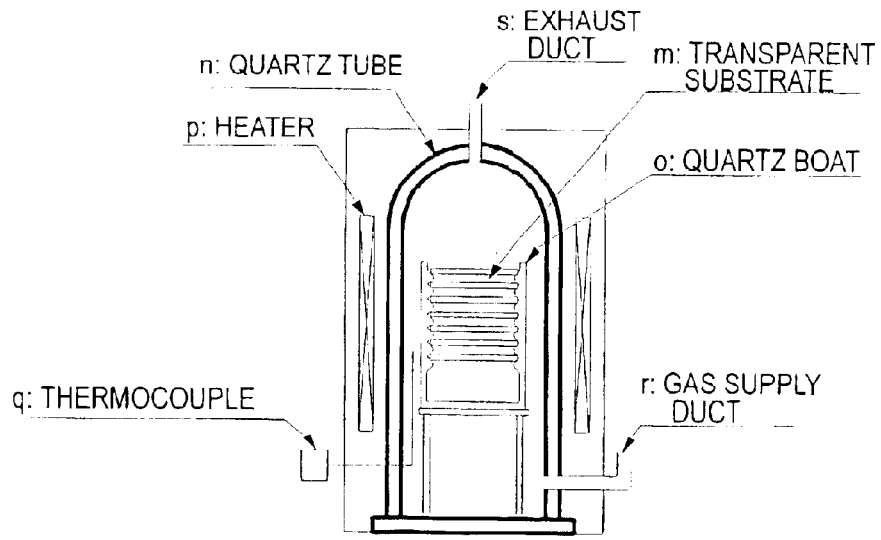
FIG. 4 shows an outline of a vertical furnace used for heat treatment.

The transparent substrate (m) processed in the manner as above to have a semi-transmission area on its surface is heated in a vertical furnace as in FIG. 4. The vertical furnace has a quartz tube (n), in which is disposed a quartz boat (o). The semi-transmission film-coated, transparent substrate (m) is mounted on the quartz boat (o). The quartz tube (n) is heated by the heater (p) disposed around it. The semi-transmission film-coated, transparent substrate (m) is heated by the radiation heat from the quartz tube (n).

The power of the heater (p) is controlled by monitoring the temperature of the thermocouple (q) inserted into the quartz tube (n). Through the gas supply duct (r) fitted to the quartz tube (n), an inert gas such as nitrogen is introduced into the quartz tube (n); and the gas introduced thereinto is discharged out of the quartz tube (n) through the exhaust duct (s) also fitted to the quartz tube (n). Introducing the inert gas such as nitrogen into the quartz tube (n) is to prevent the surface of the semi-transmission film from being oxidized. Another advantage of the gas circulation in the quartz tube (n) is that the heat of the quartz tube (n) is effectively transferred to the semi-transmission film-coated, transparent substrate (m), and the temperature in the quartz tube (n) is kept uniform.

Measurement of Transmittance and Phase Angle

To measure the transmittance and the phase angle of the semi-transmission film, used is MPM193 manufactured by Lasertec Corporation. The sample is prepared as follows. That is, using an oily ink marker, the nude transparent substrate not coated with a semi-transmission film is marked. After the substrate has been coated with the film, the film in the marked part of the substrate is removed with an organic solvent such as acetone. The thus-treated marked part of the coated substrate has no film, and this is an open area of the substrate. The transmittance of the film-coated area of the substrate and that of the non-coated open area thereof are measured. The transmittance of the semi-transmission film is represented by a relative value, percentage relative to that of the open area of the substrate of being 100%. The optical phase difference between the light running through the film-coated area of the substrate and that through the non-coated open area thereof indicates the phase angle of the semi-transmission film.

Measurement of Substrate Planarity

To measure the substrate planarity, used is Flatmaster 200 manufactured by Tropel Corporation. The substrate planarity change is obtained by subtracting the planarity of the non-coated transparent substrate from that of the substrate coated a semi-transmission film. Prior to the measurement, the fixer of the substrate is so controlled that the mean face of the substrate is parallel to the prism. The substrate planarity is defined by the height difference between the highest part of the face of the substrate to be coated with a semi-transmission film and the lowest part thereof. To accurately determine the influence of the compression stress of the semi-transmission film formed thereon, the sample of the transparent substrate of which the planarity is to be measured is so selected that the face in the center part of the substrate is the highest and the four edges thereof are the lowest at the same level.

EXAMPLES

Figure 5:
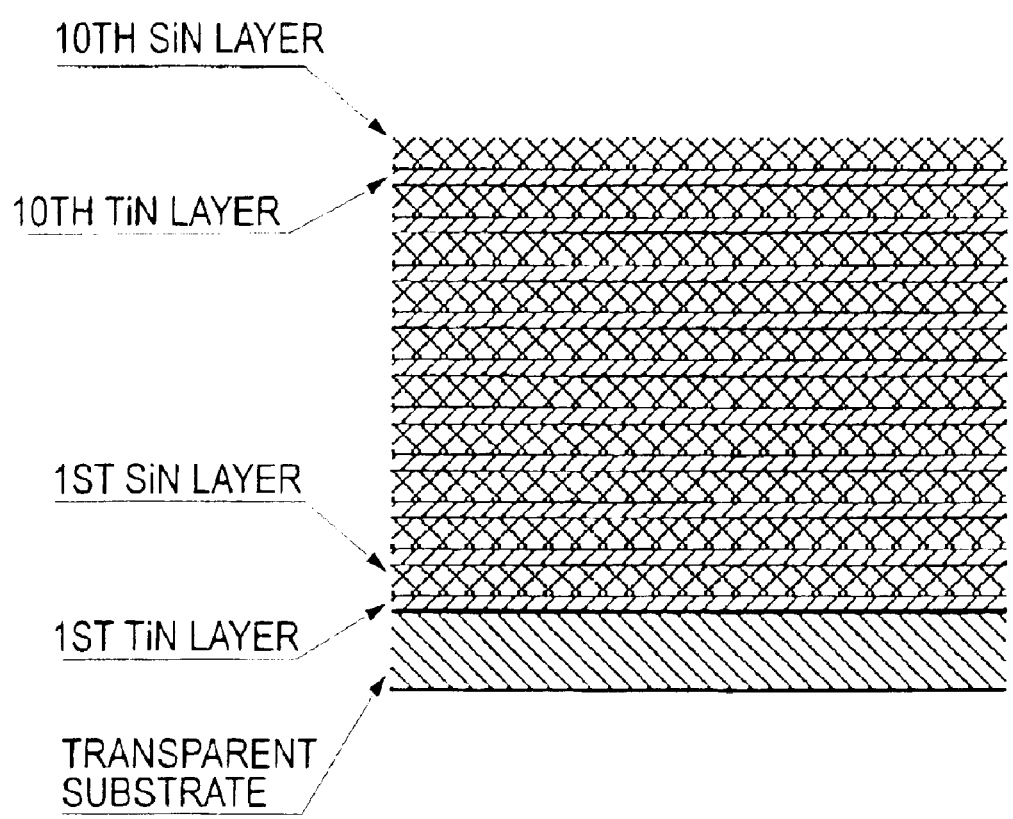
FIG. 5 shows a layer constitution of a semi-transmission film of Example 1.

Using an ion beam sputtering device, a semi-transmission film was formed on a square, synthetic quartz substrate of 152 mm×152 mm×6.35 mm (thickness), by alternately depositing titanium nitride and silicon nitride in that order on the substrate. The number of the alternate layers is 10 each, therefore totaling 20 layers. The thickness of each layer and the total thickness of the laminated layers were so controlled that the laminate film formed could have the optimum phase angle and the optimum transmittance favorable for halftone phase shift mask blanks for patterning exposure to ArF excimer laser (193 nm). Concretely, the thickness of every titanium nitride layer was 8.5 angstroms, and that of every silicon nitride layer was 64.5 angstroms. The overall thickness of the multi-layered laminate film is relatively smaller than the total thickness of all the layers constituting the film. Accordingly, the overall thickness of the laminate film formed herein was about 720 angstroms. FIG. 5 shows the layer constitution of the semi-transmission film of Example 1.

The phase angle of the thus-formed, semi-transmission film was 181.9°, and the transmittance thereof was 6.5% relative to the transmittance of the non-coated transparent substrate of being 100%. The substrate planarity change was 1.3 μm, compared with the planarity of the non-coated substrate.

Next, the semi-transmission film-coated substrate was put into a vertical furnace and heated at 600° C. for 1 hour. Before the coated substrate was heated therein, nitrogen gas was introduced into the quartz tube in the vertical furnace, and the tube was purged with the nitrogen gas to reduce the oxygen concentration therein to at most 10 ppm. After thus heated, the phase angle of the semi-transmission film was 180.3°, and the transmittance thereof was 8.2% relative to the transmittance of the non-coated substrate of being 100%. The film thickness increased to 735 angstroms after the heat treatment. Compared with the planarity of the non-coated substrate, the coated substrate planarity change after the heat treatment was 0.5 μm. This means that the substrate planarity change owing to the film stress was decreased by 0.8 μm by the heat treatment.

On the semi-transmission film formed on the substrate in the manner as above, further formed was an anti-glare Cr film. Then, this was coated with a photoresist to fabricate a halftone phase shift mask blank.

In Example 1, the transmittance and the phase angle varied through the heat treatment. In the invention, the semi-transmission film is formed on a substrate with the transmittance change and the phase angle change of the film after heat treatment being taken into consideration. Table 1 below shows the data of the transmittance change, the phase angle change and the substrate planarity change of different samples after heat treatment at different temperatures. In Examples 2 and 3 and Comparative Examples 1 and 2, the semi-transmission film was formed in the same manner as in Example 1.

TABLE 1

| | Temperature in Heat Treatment | Transmittance Change (at 193 nm) | Phase Angle Change (at 193 nm) | Substrate Planarity hange |
|---|---|---|---|---|
| Example 1 | 600° C. | 1.42% | −1.6° | 0.8 μm |
| Example 2 | 400° C. | 0.68% | −0.6° | 0.5 μm |
| Example 3 | 500° C. | 0.89% | −1.3° | 0.6 μm |
| Comparative Example 1 | not heated | 0 | 0 | 0 |
| Comparative Example 2 | 200° C. | 0.24% | −0.2° | 0.1 μm |

In Example 1, 10 titanium nitride layers and 10 silicon nitride layers were alternately laminated to form the semi-transmission film. The layer lamination frequency may be varied, not smaller than at least two. The thickness of each titanium nitride layer and that of each silicon nitride layer may also be varied.

In Example 1, the ratio of the thickness of the titanium nitride layer to that of the silicon nitride layer is 13.2%. The ratio of the titanium nitride layer thickness may be varied to thereby vary the transmittance of the film. Table 2 below shows the data of transmittance of other Examples in which the ratio of the thickness of the titanium nitride layer to that of the silicon nitride layer was varied. The thickness of the semi-transmission film in the Examples shown in Table 2 was so controlled that the phase angle of the film to ArF excimer laser (193 nm) could be about 182±2°.

TABLE 2

| | TiN/SiN | Transmittance before Heat Treatment (at 193 nm) |
|---|---|---|
| Example 1 | 13.2% | 5.8% |
| Example 4 | 6.0% | 10.3% |
| Example 5 | 10.0% | 7.4% |

What is claimed is:

1. A method for producing a halftone phase shift mask blank having a semi-transmission film on a transparent substrate, comprising the steps of:

alternately laminating, on a transparent substrate, thin layers substantially made of nitrogen and titanium and thin layers substantially made of nitrogen and silicon to thereby form thereon a multi-layered semi-transmission film; and heating the semi-transmission film at 300° C. or higher.

2. The method for producing a halftone phase shift mask blank as claimed in claim 1, wherein:

the semi-transmission film is formed by ion beam sputtering.

3. A mask blank produced according to the method of claim 1.

4. A mask produced by patterning the thin layers of the mask blank of claim 3.

* * * * *